United States Patent
Weiner et al.

(10) Patent No.: US 6,732,002 B1
(45) Date of Patent: May 4, 2004

(54) APPARATUS AND METHODS FOR PREDICTING MULTIPLE PRODUCT CHIP YIELDS THROUGH CRITICAL AREA MATCHING

(75) Inventors: Kurt H. Weiner, San Jose, CA (US); Gaurav Verma, Atherton, CA (US)

(73) Assignee: KLA-Tencor Corporation, San Jose, CA (US)

( * ) Notice: Subject to any disclaimer, the term of this patent is extended or adjusted under 35 U.S.C. 154(b) by 127 days.

(21) Appl. No.: 09/991,188

(22) Filed: Nov. 14, 2001

Related U.S. Application Data

(60) Provisional application No. 60/314,609, filed on Aug. 23, 2001.

(51) Int. Cl.[7] .............................................. G06F 19/00
(52) U.S. Cl. ..................................... 700/110; 702/183
(58) Field of Search ........................ 700/109–110, 121; 250/310; 324/750–751; 702/183, 184

(56) References Cited

U.S. PATENT DOCUMENTS

| | | | | |
|---|---|---|---|---|
| 5,502,306 A | | 3/1996 | Meisburger et al. ......... | 250/310 |
| 5,548,211 A | * | 8/1996 | Tujide et al. ............. | 324/158.1 |
| 5,578,821 A | | 11/1996 | Meisberger et al. ......... | 250/310 |
| 5,665,968 A | | 9/1997 | Meisburger et al. ......... | 250/310 |
| 5,717,204 A | | 2/1998 | Meisburger et al. ......... | 250/310 |
| 5,959,459 A | | 9/1999 | Satya et al. .................. | 324/751 |
| 6,038,018 A | | 3/2000 | Yamazaki et al. ........ | 356/237.1 |
| 6,066,179 A | * | 5/2000 | Allan ............................ | 716/4 |
| 6,091,249 A | | 7/2000 | Talbot et al. ................ | 324/751 |
| 6,210,983 B1 | | 4/2001 | Atchison et al. .............. | 438/14 |

(List continued on next page.)

FOREIGN PATENT DOCUMENTS

| | | | | |
|---|---|---|---|---|
| EP | 0853243 A2 | 7/1998 | ......... | G01R/31/305 |
| EP | 092275 A2 | 1/1999 | ......... | G01R/31/307 |

OTHER PUBLICATIONS

Allan et al., Fast yield prediction for accurate costing of ICs, Oct. 1996, Eighth Annual IEEE International Conference on, Oct. 1–9, 1996, pp. 279–287.*

*Primary Examiner*—Leo Picard
*Assistant Examiner*—Zoila Cabrera
(74) *Attorney, Agent, or Firm*—Beyer, Weaver & Thomas, LLP.; Mary R. Olynick, Esq.

(57) ABSTRACT

Disclosed are methods and apparatus for sampling defects. A test chip having a plurality of test structures is provided that is designed so that defect sampling may be customized to obtain different critical areas from the test chip. Each test structure is conceptually divided into a plurality of unit cells (e.g., a pair of grounded and floating conductive lines). The defects of a percentage of unit cells may then be sampled for each test structure to conceptually form a sub test structure that has a different size than the original test structure. The percentage of unit cells that are sampled for each test structure is chosen so as to achieve a specific critical area curve. The defects from each sampled set of unit cells may then combined to determine yield for a product chip having the same specific critical area curve. These defect sampling techniques are customizable for different product chips having different critical areas to thereby predict product yield for such product chips using the same test chip. In general terms, a first set of unit cells may be sampled from the test structures to predict yield for a product chip having a first critical area, and a second different set of unit cells may be sampled to predict yield for a product chip having a second critical area. The test structures may have different characteristics, such a different line widths and spacing, that are sampled for defects to provide different critical area curves. In other specific implementations, one or more test structure may have one or more attributes that affect systematic yield, as compared to random attributes which affect random yield.

23 Claims, 7 Drawing Sheets

U.S. PATENT DOCUMENTS

| | | | |
|---|---|---|---|
| 6,252,412 B1 | 6/2001 | Talbot et al. | 324/750 |
| 6,265,232 B1 | 7/2001 | Simmons | 438/14 |
| 6,269,326 B1 | 7/2001 | Lejeune | 703/2 |
| 6,344,750 B1 | 2/2002 | Lo et al. | 324/751 |
| 6,365,423 B1 * | 4/2002 | Heinlein et al. | 438/14 |
| 6,426,501 B1 * | 7/2002 | Nakagawa | 250/310 |
| 6,476,390 B1 * | 11/2002 | Murakoshi et al. | 250/310 |
| 2001/0016061 A1 * | 8/2001 | Shimoda et al. | 382/149 |

* cited by examiner

APPARATUS AND METHODS FOR PREDICTING MULTIPLE PRODUCT CHIP YIELDS THROUGH CRITICAL AREA MATCHING

CROSS-REFERENCE TO RELATED APPLICATION

This application takes priority under U.S.C. 119(e) of United States Provisional Application No.: 60/314,609 filed Aug. 23, 2001 entitled, "APPARATUS AND METHODS FOR PREDICTING MULTIPLE CHIP YIELDS THROUGH CRITICAL AREA MATCHING" Kurt H. Weiner and Gaurav Verna, which is incorporated by reference in its entirety for all purposes.

BACKGROUND OF THE INVENTION

This invention relates to methods and apparatus for detecting defects in a semiconductor test structure to thereby predict product yield. More particularly, it relates to voltage contrast techniques for inspecting test structures to predict product yield across multiple product chips having different critical areas.

A voltage contrast inspection of a test structure is accomplished with a scanning electron microscope. The voltage contrast technique operates on the basis that potential differences in the various locations of a sample under examination cause differences in secondary electron emission intensities when the sample is the target of an electron beam. The potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

A secondary electron detector is used to measure the intensity of the secondary electron emission that originates from the path swept by the scanning electron beam. Images may then be generated from these electron emissions. A defective portion can be identified from the potential state or appearance of the portion under inspection. The portion under inspection is typically designed to produce a particular potential and resulting brightness level in an image during the voltage contrast test. Hence, when the scanned portion's potential and resulting image appearance differs significantly from the expected result, the scanned portion is classified a defect.

One inventive test structure designed by the present assignee is disclosed in co-pending U.S. patent application Ser. No. 09/648,093 by Akella V.S. Satya et al., filed Aug. 25, 2000, which application is incorporated herein in its entirety. This test structure is designed to have alternating high and low potential conductive lines during a voltage contrast inspection. In one inspection application, the low potential lines are at ground potential, while the high potential lines are at a floating potential. However, if a line that is meant to remain floating shorts to an adjacent grounded line, both lines will now produce a low potential during a voltage contrast inspection. If there is an open defect present within a line that is supposedly coupled to ground, this open will cause a portion of the line to be left at a floating potential to thereby produce a high potential during the voltage contrast inspection. Both open and short defects causes two adjacent lines to have a same potential during the voltage inspection.

The results from inspecting a test structure may then be used to predict yield of a product chip that is fabricated with the same process as the test structure. Given a particular defect, yield prediction of a chip (i.e., the probability that the chip will fail) depends on the critical area associated with the particular defect and the probability that the particular defect will fall within the associated critical area. Critical area refers to the total area of the chip as a function of the defect size in which the defect can occur and cause a fault (e.g., a short or open). FIGS. 1A and 1B illustrate the concept of critical area. Each specific configuration of semiconductor circuit, pattern, and test structure has an associated critical area for a given defect size. Additionally, each specific circuit, pattern, and test structure has an associated critical area curve as a function of defect size. FIG. 1A is a diagrammatic top view of a simple test structure 100 having two conductive lines 102a and 102b. The lines 102a and 102b both have a width 104 and a line spacing 106.

FIG. 1B is a graph of critical area as a function of defect size for the test structure 100 of FIG. 1A. A defect 110 that is sized to be less than the line spacing will not cause a fault (e.g., short) in any area of test structure 100. As shown in FIG. 1B, critical area is zero for defects sizes less than width 106. However, a defect 108 having a size (e.g., radius) equal to or greater than the width size 106 will have an associated critical area in which it causes a fault. For example, if the defect 108 is positioned in a narrow area 109 that runs down the centerline between the two lines 102, it will cause a fault by shorting the two lines 102. This narrow area 109 is the critical area for defect 108. The critical area will continue to increase for increasingly sized defects until a critical area plateaus is reached. This plateau is reached at a particular defect size for which the critical area equals the area of the test structure. For this test structure 100, the critical area plateaus at a defect size that is twice the width of the line spacing 106.

Although the yield for a product chip having the same critical area may be predicted based on the test structure, the yield for a product chip having a different critical area than the test structure may not be accurately calculated using the test structure defect data. FIG. 2 shows illustrative plots of critical area for a test structure as a function of defect size, critical area of a particular product chip as a function of defect size, and the number of defects measured for the test structure as a function of defect size.

The defect counts are measured on the test structure, for example, for defect sizes greater than 204. In this example, defects having a size less than 204 are simply not captured because of limitation in the metrology tool. Thus, the defect size distribution (i.e., defect count as a function of defect size) for the test structure may be plotted for defect sizes 204 and higher.

Yield for a particular chip is based on the area under both of its related defect size distribution and critical area curves. Thus, yield for a product chip that has a different critical area than the test structure's critical area is typically based on the product's critical area curve (i.e., not the test structure's critical area curve) and defect size distribution curve. As shown, yield for the product chip is equal to area 206. Although the critical area of the product chip is known, its defect size distribution curve is not known within tolerable certainty. In the illustrated example, defect size distribution has an associated margin of error 208. Unfortunately, this uncertainty is introduced into the yield calculation for the product. As a result, a product yield prediction that is based on a measured defect size distribution curve may be inaccurate and unreliable due to the inaccuracy of the defect size distribution curve.

Accordingly, there is a need for mechanisms for more accurately predicting yield across multiple product chips having different critical areas.

SUMMARY OF THE INVENTION

Accordingly, a test chip having a plurality of test structures is provided that is designed so that defect sampling may be customized to obtain different critical areas from the test chip. Each test structure is conceptually divided into a plurality of unit cells (e.g., a pair of grounded and floating conductive lines). The defects of a percentage of unit cells may then be sampled for each test structure to conceptually form a sub test structure that has a different size than the original test structure. The percentage of unit cells that are sampled for each test structure is chosen so as to achieve a specific critical area curve. The defects from each sampled set of unit cells may then combined to determine yield for a product chip having the same specific critical area curve.

These defect sampling techniques are customizable for different product chips having different critical areas to thereby predict product yield for such product chips using the same test chip. In general terms, a first set of unit cells may be sampled from the test structures to predict yield for a product chip having a first critical area, and a second different set of unit cells may be sampled to predict yield for a product chip having a second critical area. Preferably, the granularity of each unit cell is relatively small (e.g., equal to or less than 25 $\mu$m) to achieve different critical area curves by combining a different number of unit cells. In one example, the granularity of each cell has a width equal to two line widths (e.g., a floating and grounded line) plus line spacing. Conventional test structures that implement probe pads cannot achieve such small granularity as test structures of the present invention because each probe pad tends to be relatively large (e.g., 100 to 200 $\mu$m).

Each unit cell may have different attribute values that affect random yield (herein referred to as "random" attributes). For example, these random attributes may include line spacing and line width. The test structure may also have different values for their random attributes. For example, the test structures may have different combinations of values for line width and spacing.

In one embodiment, the percentages of unit cells that are sampled from the test structures are selected to achieve a specific critical area curve. The sampled defect data is then combined to achieve the specific critical area curve for the sampled test structures. In other words, a critical area curve is formed based on the percentage of unit cells sampled from each different type of test structure. For instance, a first percentage of unit cells are sampled from a first test structure having a first set of line width and spacing values and a second percentage is sampled from a second test structure having a second set of line width and spacing values that differ from the first set. After a particular critical area curve is achieved, random yield for a product chip having the particular critical area may then be predicted from the sampled defect data.

In other specific implementations, one or more test structure also may have one or more attributes that affect systematic yield (herein referred to as "systematic" attributes), as compared to the above described random attributes which affect random yield. A test chip may include one or more test structures that include systematic attributes that represent systematic attributes found on various product chips. Defects may then be selectively sampled from one or more test structures that represent a particular product chip. This defect data may be used to predict systematic yield. The predicted systematic yield may then be combined with the predicted random yield to predict total yield for a particular product.

In one embodiment, a method of sampling a test chip having a plurality of test structures is disclosed. In a voltage contrast inspection, defects are sampled from a first set of selected percentage areas of one or more test structures. The sampled defects from the first set of selected percentage areas are combined. The first set of the percentage areas are selected so that the combined sampled defects from the first set of selected percentage areas have an associated first critical area curve.

In a preferred implementation, the first critical area curve substantially matches a first product chip's critical area curve. In a further embodiment, defects are sampled from a second set of selected percentage areas of one or more test structures. The sampled defects from the second set of selected percentage areas are combined. The second set of the percentage areas are selected so that the combined sampled defects from the second set of selected percentage areas have an associated second critical area curve that differs from the first critical area curve. Preferably, the first critical area curve substantially matches a first product chip's critical area curve and the second critical area curve substantially matches a second product chip's critical area curve.

In another aspect, a first yield is predicted based on the sampled defects from the first set of selected percentage areas. The first yield is applicable to any product chip having the same first critical area curve as the sampled defect data from the first set of selected percentage areas. A second yield is predicted based on the sampled defects from the second set of selected percentage areas. The predicted yield is applicable to any product chip having the same first critical area curve as the sampled defect data from the second set of selected percentage areas. In a further implementation, the first and second yields are provided to designers of product chips, and a product chip that has the same characteristics as test structures that were sampled to achieve either the first or second yield, whichever is higher, is designed. In another embodiment, a product chip that excludes the same characteristics as test structures that were sampled to achieve either the first or second yield, whichever is lower, is designed.

In a specific implementation, a first percentage area of a first test structure is sampled for defects and a second percentage area of a second test structure is sampled for defects. The first percentage area differs from the second percentage area. The first test structure has a first set of characteristics that differ from a second set of characteristics of the second test structures. The first and second set of characteristics each include a set of line width and line spacing values.

In yet another embodiment, a first yield is predicted based on the sampled defects from the first set of selected percentage areas. The first yield is applicable to any product chip having the same first critical area curve as the sampled defect data from the first set of selected percentage areas. In a specific aspect, the test structures include random test structures that are designed for accurate prediction of the first yield and systematic test structures that are designed for accurate prediction of a systematic yield for a same type of structure as the systematic test structures. The systematic test structures are selectively sampled for defects so that the systematic yield is predicted for selected types of structures. The first yield is combined with the systematic yield to obtain a total yield. The total yield may be provided to designers of product chips where a product chip is designed based on the provided total yield.

In another aspect, the invention pertains to a computer program product for sampling a test chip having a plurality of test structures using an inspection system. The computer program product includes at least one computer readable medium and computer program instructions stored within the at least one computer readable product configured to cause the inspection system to performed one or more of the above described methods. In another embodiment, the invention pertains to an inspection system for sampling a test chip having a plurality of test structures. The system includes a beam generator for generating an electron beam, a detector for detecting electrons, and a controller arranged to perform one or more of the above described methods.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Figure 1A:
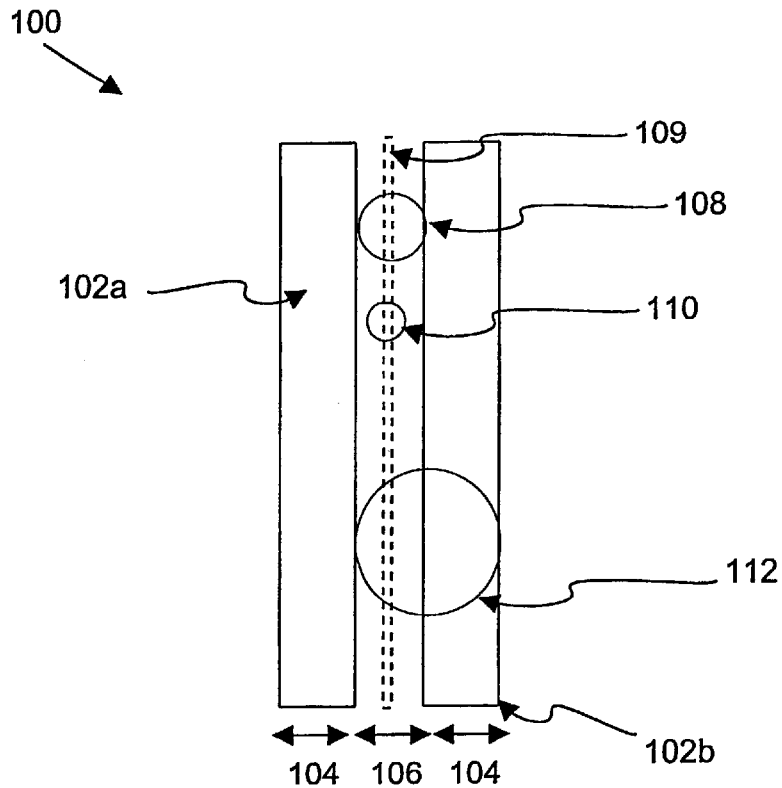
FIG. 1A is a diagrammatic top view of a simple test structure having two conductive lines.
Figure 1B:
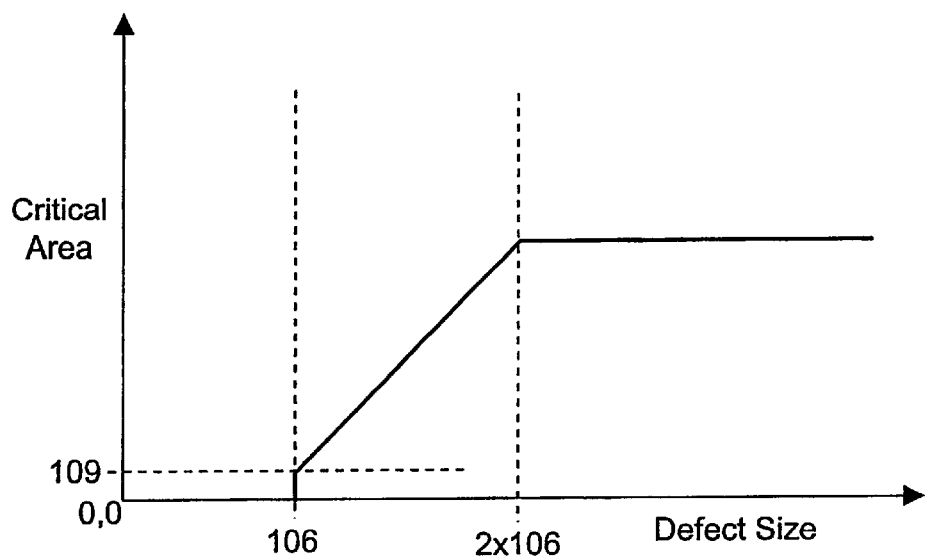
FIG. 1B is a graph of critical area as a function of defect size for the test structure of FIG. 1A.
Figure 2:
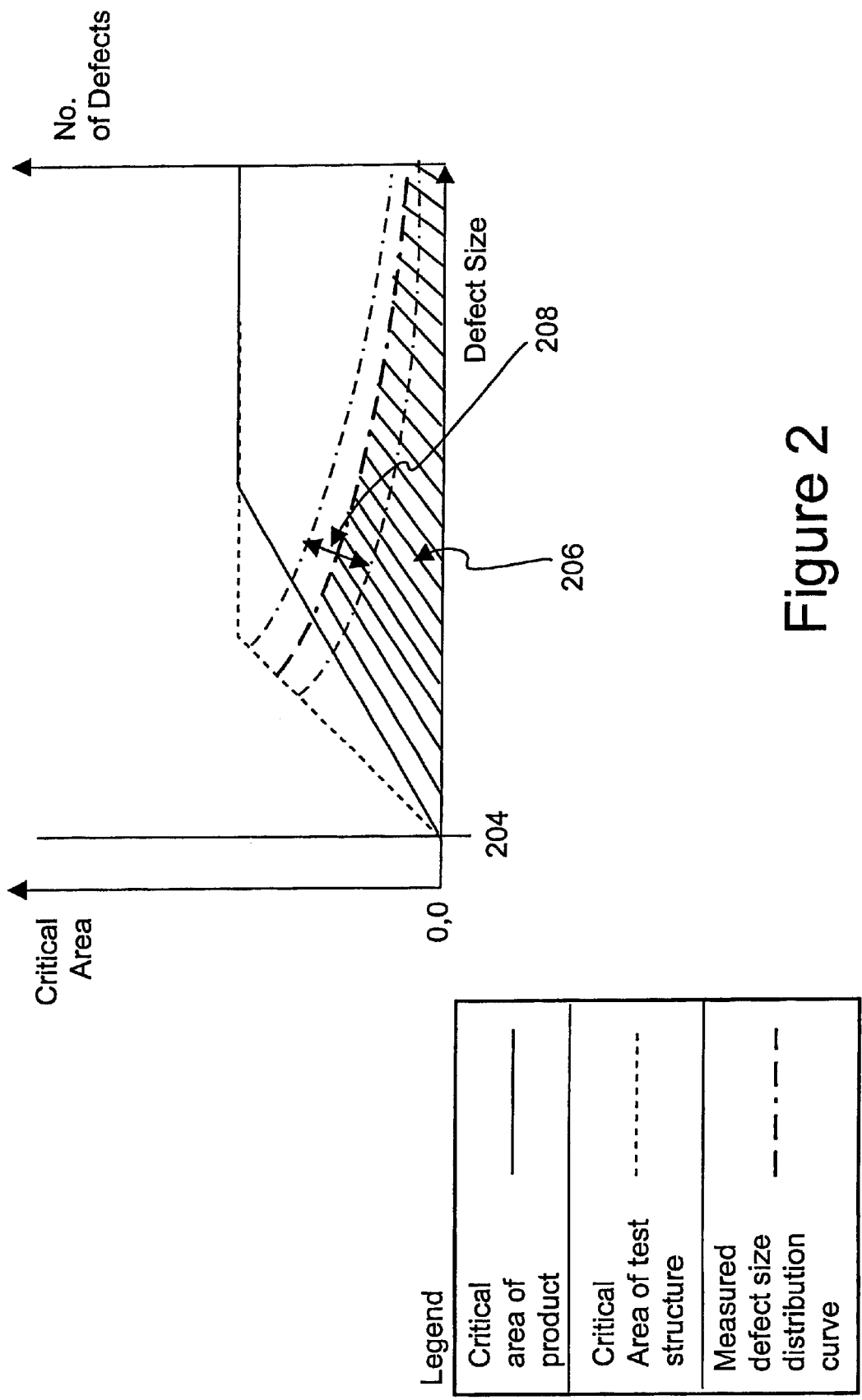
FIG. 2 shows illustrative plots of critical area 1 for a test structure as a function of defect size, critical area 2 of a particular product chip as a function of defect size, the number of defects measured for the test structure as a function of defect size, and a hypothetical number of defects for the product chip as a function of defect size.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The detection techniques of the present invention may be applied to any type of structures having features that respond to a voltage contrast inspection in a known way when defects are not present within the test structure and may be sampled for defects so as to conceptually form differently sized sub test structures from the original test structure. Hence, the test structures include features that will have particular voltage potentials when scanned with an electron beam. Some of the features may retain a low potential, while other features charge up to a higher potential. When an image is generated from electrons emitted from the scanned features, the image will also depend on the features' particular potentials achieved or retained during the electron beam scan. For example, a features having a low potential may result in a bright feature, while a feature with a high potential may result in a dark feature within the image. Alternatively, low potential features may appear dark, and high potential features appear bright.

Since the test structure is designed to result in a particular image, one may determine whether there is a defect in a portion of the test structure by comparing the imaged "target" portion to a reference image having no defects. The reference image may be an identical portion of the test structure or may be generated from a design database (e.g., that was used to fabricate the test structure). Significant differences between the target and the reference images may be classified as defects.

Additionally, the percentage areas in which defects are sampled may be varied for each test structure. For instance, each test structure is designed so that it may contain defects in any one of a plurality of conceptual unit cells. In one embodiment, each unit cell includes a pair of conductive lines that are designed to appear as a bright line and a dark line during a voltage contrast inspection. Two dark lines or two bright lines within the same unit cell are classified as a defect. This design allows a certain percentage of unit cells to be sampled for defects so as to obtain a sub test structure having a particular size and associated critical area curve. Preferably, the granularity of each unit cell is relatively small to achieve different critical area curves by combining a different number of unit cells. In one specific implementation, the granularity of each unit cell is equal to or less than 25 µm. In the previous example, the granularity of each cell has a width equal to two line widths (e.g., a floating and grounded line) plus two line spacings. The present invention includes mechanisms for sampling and combining the detected defects from a plurality of test structures so as to mimic a specific critical area curve and then predict yield for a product chip having the same specific critical area curve.

Figure 3:
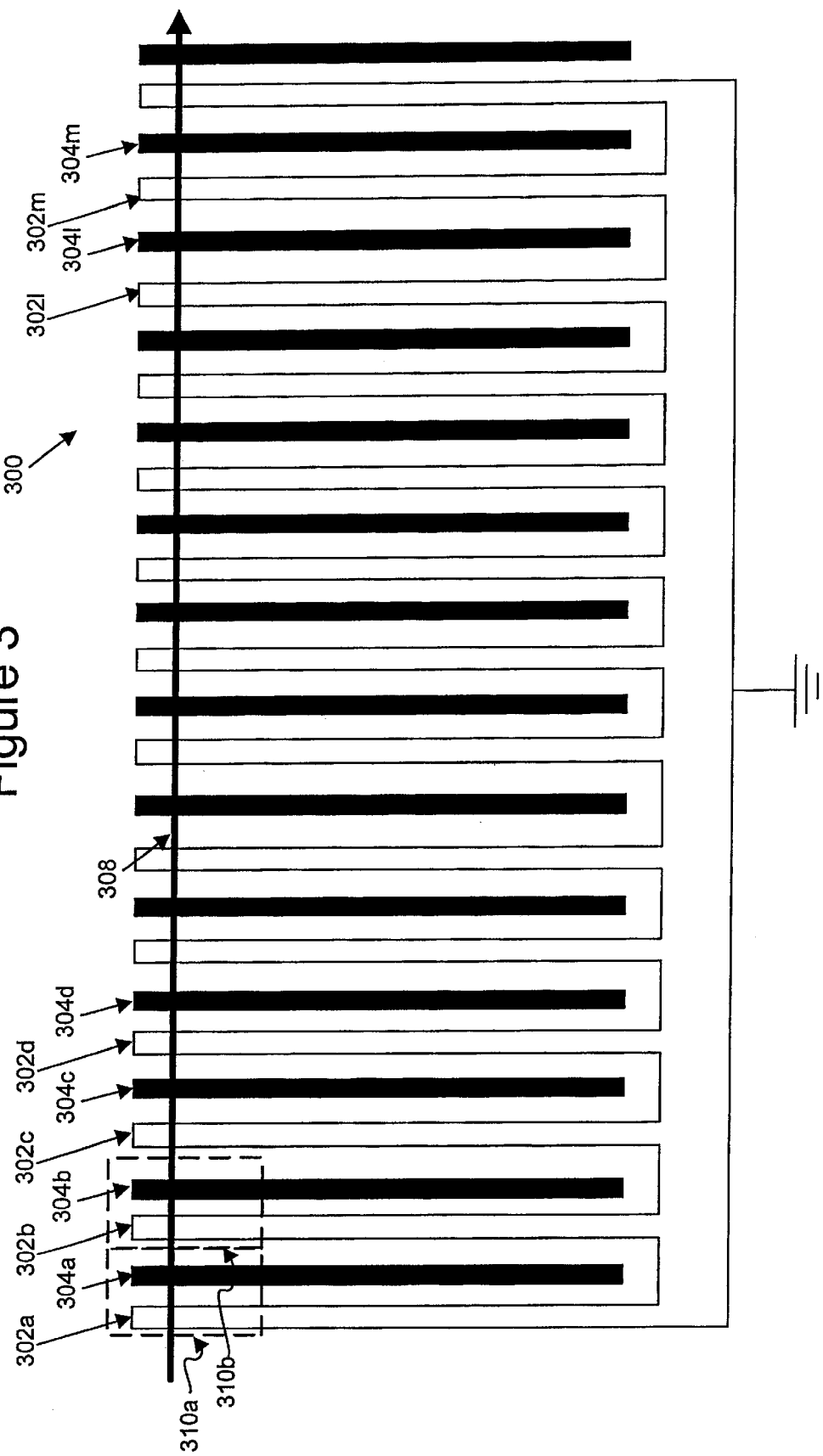
FIG. 3 is a diagrammatic top view representation of a test structure in which the sampling and yield prediction techniques of the present invention may be implemented.

FIG. 3 is a diagrammatic top view representation of a test structure 300 in which the sampling and yield prediction techniques of the present invention may be implemented. Test structure 300 is referred to as a comb-like structure. As shown, the test structure 300 includes a plurality of grounded conductive lines 302 and a plurality of floating conductive line 304. Voltage contrast images of a top portion of the conductive lines 302 and 304 are generated as an electron beam moves in direction 308. Each image (e.g., 310a and 310b) is referred herein to as an "image cell."

Preferably, the image cells correspond to feature portions that are designed to result in substantially identical images when no defects are present. In one embodiment, an image cell is generated for a top portion of each pair of grounded and floating lines. However, other portions of the features (e.g., a middle portion of the conductive lines) may be scanned. As shown, when the conductive lines are scanned in direction 308, cell 310a is first obtained and then cell 310b is obtained. Since the test structure 300 is expected to have alternating lines of grounded and floating potential, each image cell is expected to contain a bright line and a dark line. For example, the grounded lines 302 will appear bright, while the floating lines 304 will appear dark. Of course, the inspection tool may be set up so that the grounded lines 302 appear dark and the floating lines 304 appear bright. The specific intensity values of the conductive lines as the electron beam scans across them may also be ascertained to determine defects. When there are no defects, the intensity values are expected to include alternating high and low intensity values.

Figure 4:
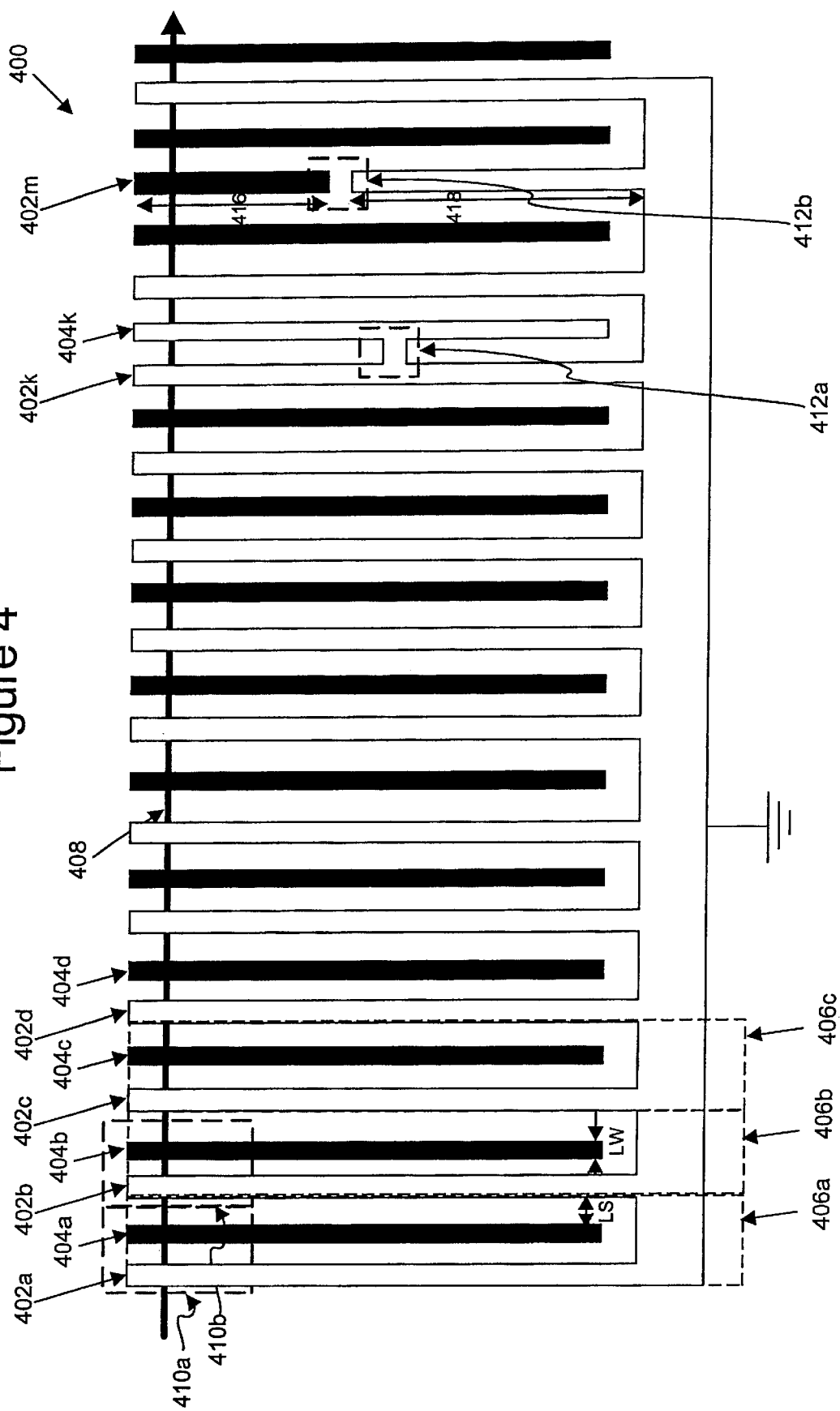
FIG. 4 is a diagrammatic top view representation of a test structure having defects in which the sampling and yield prediction techniques of the present invention may be implemented.

FIG. 4 is a diagrammatic top view representation of a test structure 400 having defects in which the sampling and yield prediction techniques of the present invention may be implemented. As shown, there is an electrical short 412a between line 402k and 404k. This short 412a causes both lines 402k and 404k to appear bright. Another type of electrical defect that may occur in a test structure 400 is an open. As shown, there is an open defect 412b in line 402m. An open defect causes a portion 416 of line 402m to have a floating potential. Accordingly, the floating portion 416 will appear dark, while the portion of the line that remains coupled to ground (418) will have a bright appearance.

In sum, when two lines are shorted together, both lines will appear bright when scanned in direction 408. In contrast, when a line that is designed to be grounded contains an open, the top portion 416 of such line has the same dark appearance as its neighboring floating conductive lines when scanned in direction 408. Accordingly, when the electron beam moves in direction 408, a defect may be found when a particular cell is subtracted from another cell. For example, cell 410b may be subtracted from cell 410a. If the particular cell does not have a defect, this subtraction will ideally produce zero results. In contrast, when the particular cell has a defect, this subtraction will produce a significant difference that is then classified as defect. Electron beam tool parameter settings determine the percentage difference between the two cells that will be classified as a defect. The parameter settings may be experimentally determined and adjusted, for example, on a sample having a known number of defects.

The test structure may contain electrical defects, as well as physical defects. The physical defects may take any form, such as bumps along the edge of the line, indentations along the edge of the line, or holes within the center of the line. Preferably, mechanisms for filtering physical defects from electrical defects are also provided. Several techniques for filtering physical defects from electrical defects are described in U.S. Provisional Application No. 60/302,096 filed on Jun. 9, 2001, entitled APPARATUS AND METHODS RELIABLE AND EFFICIENT DETECTION OF VOLTAGE CONTRAST DEFECTS, by Weiner et al., which application is incorporated herein in its entirety.

In the present invention, the test structure is conceptually divided into a plurality of unit cells 406 through sampling of a selected number of unit cells. In one embodiment, each unit cell includes a grounded conductive line 402 and a floating conductive line 404. A sub test structure may be conceptually formed by sampling defects from one or more unit cells 406. For example, defects may be sampled from a single unit cell (e.g., conductive line pair 402a and 402b). As shown, a sub test structure is conceptually formed from three pairs of conductive lines or three unit cells 406a, 406b, and 406c.

The substructure's critical area is related to the number of unit cells within such substructure. For example, a substructure that is formed from three unit cells will have a different critical area than a substructure that is formed from two unit cells. In effect, the size of each substructure may be changed by sampling a specific number of unit cells within the test structure to form a sub test structure with a different size than the original test structure. More specifically, the critical area curve's total area is affected by the number of unit cells which are sampled. Thus, a critical area having a specific total area may be obtained by sampling a specific number of unit cells from a test structure.

A substructure's critical area curve is also affected by the particular characteristics of the features of the test structure. That is, a particularly shaped critical area curve may be obtained by sampling defects from a particular percentage area of a test structure having certain characteristics. These characteristics may include any suitable feature characteristic that affects yield. For example, the characteristics may include line width, line spacing.

Different critical area curves having different shapes may be combined from different test structures having different characteristics to obtain a specific critical area curve. In the illustrated embodiment, each cell 406 has an associated line width (LW) and line spacing (LS). Thus, multiple test structures may be provided, where each test structure has different characteristics, such as different LS and LW size combinations. Seven different test structure seems to work well. Different defect sampling areas may be selected for each test structure and combined to thereby obtain the desired critical area curve. For example, the defects from two unit cells are sampled for a first test structure having a first set of LS and LW values, and the defects from three unit cells are sampled for a second test structure having a second set of LS and LW values.

Figure 5:
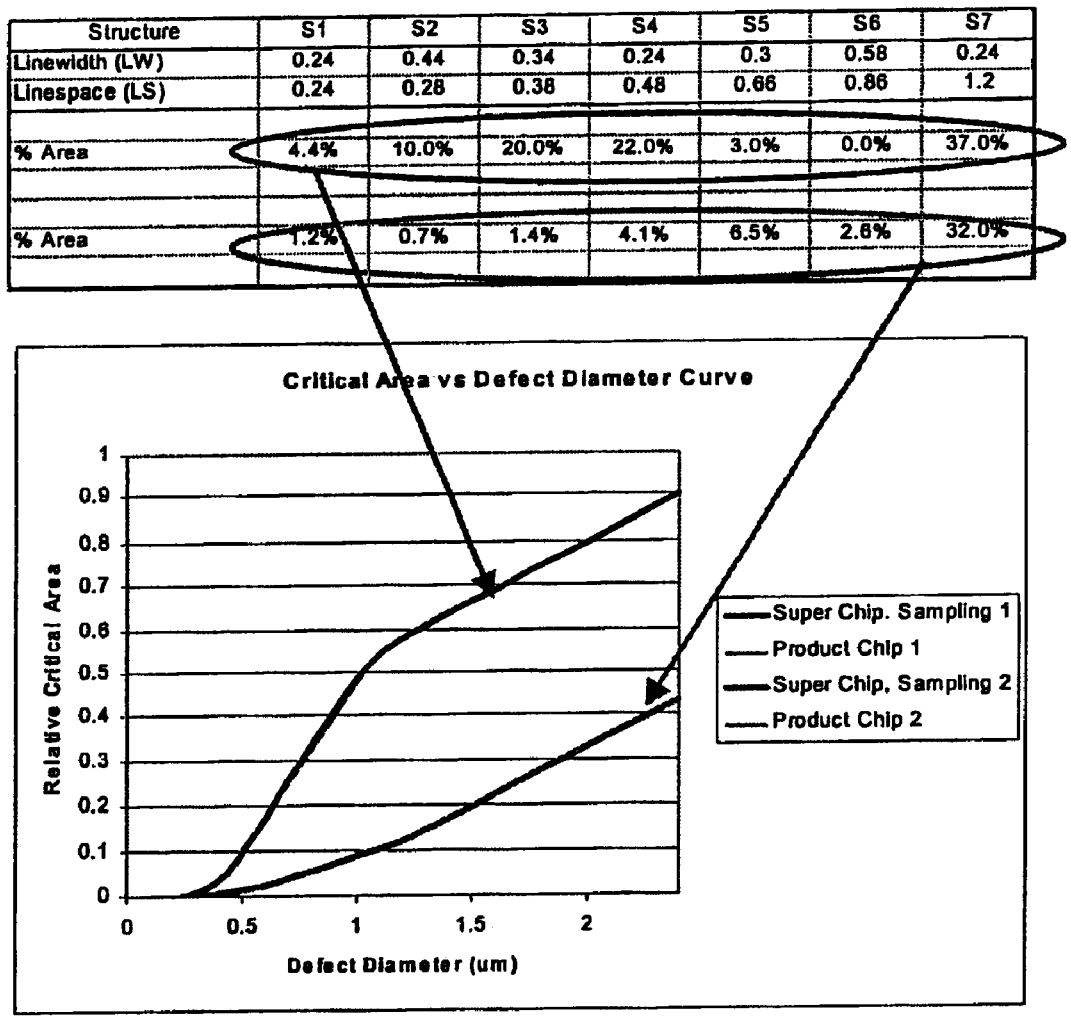
FIG. 5 shows two different sampling configurations for seven test structures on a test chip which mimic two different product chips' critical area curves.

When the defect sampling results are combined for differently sampled test structures having different configurations (e.g., different LW and LS configurations), a specific critical area curve can be obtained from the combined test structure defect samplings. That is, the critical area curves for the different test structures are combined together. FIG. 5 shows two different sampling configurations for seven different test structures formed on a test chip. The sampling configurations are each selected to mimic two different product chips' critical area curves.

As shown, each test structure (designated by S1 through S7) has different LS and LW value combinations. For both sampling runs, the unit cells of each test structure S1 through S7, respectively, have the following LW and LS configurations: 0.24 LW and 0.24 LS, 0.44 LW and 0.28 LS, 0.34 LW and 0.38 LS, 0.24 LW and 0.48 LS, 0.3 LW and 0.66 LS, 0.58 LW and 0.86 LS, 0.24 LW AND 1.2 LS.

Additionally, each test structure has a different percentage area in which defects are sampled. In one embodiment, a different number of unit cells are sampled for each test structure to conceptually form a particular sized sub test structure. As shown, for one sampling run the sub test structures are formed from the following percentage areas of their respective test structures S1 through S7, respectively: 4.4%, 10%, 20%, 22%, 3%, 0%, and 37%. In one embodiment, these percentages represent the percent of unit cells within the seven different test structures that are sampled, respectively. These sampling percentage areas and the above listed LW and LS configurations result in the critical area curve for "Sampling 1" which substantially matches the critical curve for "Product Chip 1." As shown in FIG. 5, the critical area curves for Sampling 1 is laid exactly on top of the critical area curve for Product Chip 1. Likewise, the critical area curve for the second set of sampling percentage areas (1.2%, 0.7%, 1.4%, 4.1, 6.5, 2.6, and 32%) shown as "Sampling 2" is substantially equal to the critical area curve for "Product Chip 2."

Figure 6:
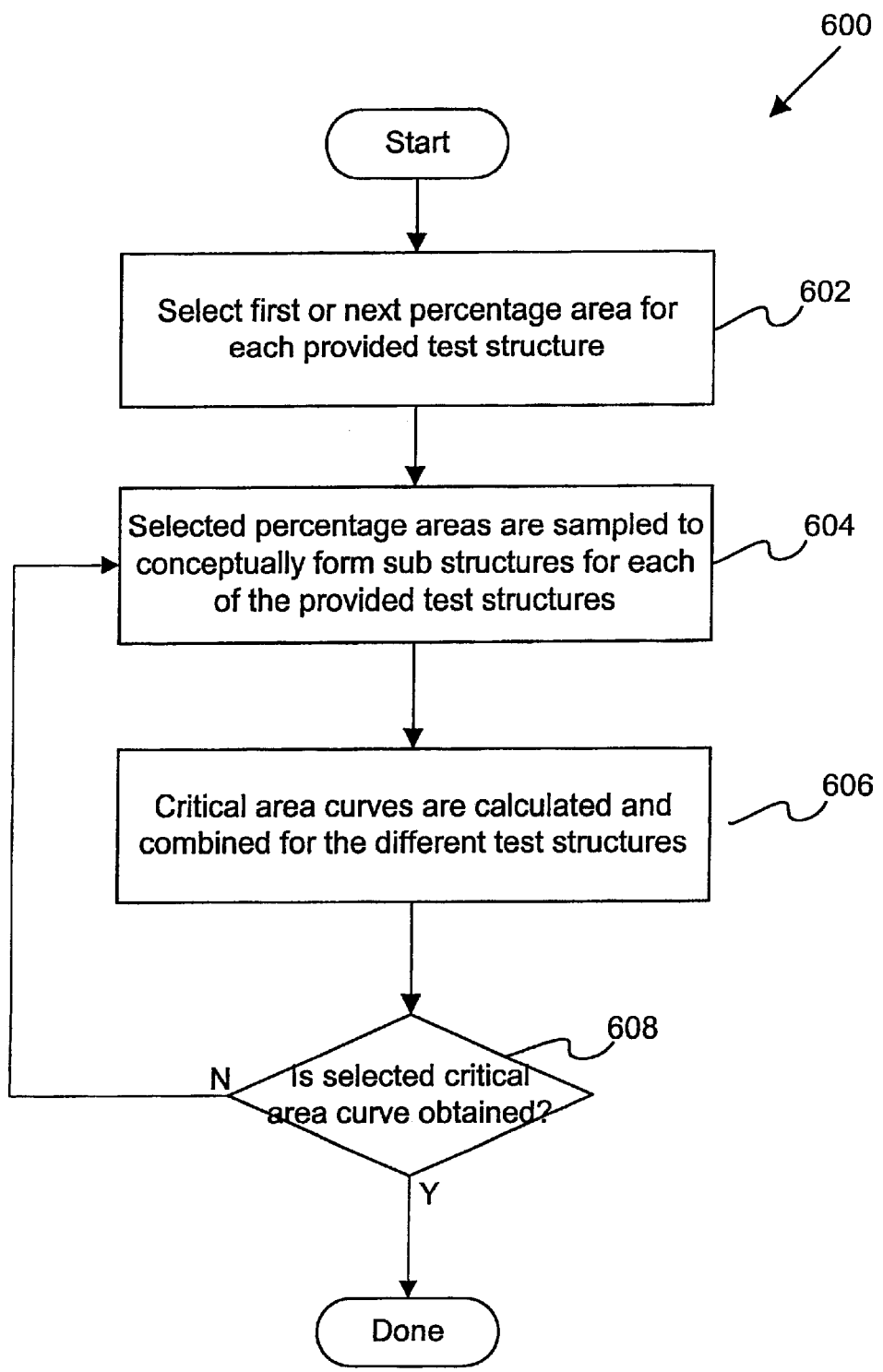
FIG. 6 is a flowchart illustrating a procedure for determining sampling percentage areas for a plurality of different test structures to obtain a particular critical area in accordance with one embodiment of the present invention.

A particular critical area may be obtained for a particular set of test structures in any suitable manner. FIG. 6 is a flowchart illustrating a procedure 600 for determining sampling percentage areas for a plurality of different test structures to obtain a particular critical area in accordance with one embodiment of the present invention. Different combinations of percentage areas are initially selected for each provided test structure in operation 602. The selected percentage areas are then sampled to conceptually form sub structures for each of the provided test structures in operation 604.

Critical area curves are then calculated and combined for the different test structures in operation 606. Techniques for calculating critical area curves are well known to those skilled in the art. In general terms, for a given substructure having a size corresponding to the selected percentage area and a given defect size, the position of the defect is varied to positions that substantially cover the entire substructure. Positions that cause failures in the device, such as a short or open, are defined as part of the critical area. In other words, defect positions that cause failures are combined to form the critical area. This procedure is repeated for different defect sizes to form a critical area curve. Commercially available software performs critical area calculations for selected test structure configurations, which may be applied to the conceptually formed sub structure configurations. One example critical area software tool is Eyes by University of Edinburgh of Edinburgh, England.

After the critical area curve for the combined substructures in calculated, it is then determined whether the desired critical area curve has been achieved in operation 608. For example, it is determined whether the calculated critical area curve substantially matches a selected product chip's critical area curve. If the desired critical area curve has not been achieved, the procedure 600 repeats for a next set of selected percentage areas. When the desired critical area is obtained, the procedure 600 ends.

When the desired critical area curve of a particular product chip has been achieved with the provided test structures, the yield of the particular product chip may then be predicted using the sampled defect results from the provided test structure. Since the critical curves of the combined sampled sub test structures (i.e., the selected sampled percentage areas) substantially matches the critical area curve of the selected product chip, the yields measured for the sub test structures may simply be combined to obtain the predicted yield of the product chip. In other words, a defect size distribution curve is not needed, as it is needed for a conventional technique. Accordingly, inaccuracies from the measured defect size distribution are not introduced into the predicted yield. In sum, the techniques of the present invention provide a more accurate mechanism for predicting yield than conventional techniques.

Additionally, a single test chip may be used to predict yield across multiple product chips having different critical area curves. As shown in FIG. 5, the same test chip (which includes test structures S1 through S7) is used to obtain two different critical area curves for two different product chips. This same test chip may also be sampled in a different manner to produce a third, fourth, etc., number of critical area curves that correspond to a third, fourth, etc., product chip. A single test chip may be utilized for several different product chips because the present invention provides mechanisms for customizing defect sampling areas for each test structure on the test chip to thereby obtain a selected critical area.

Yield is calculated in any suitable manner for each of the sampled sub test structures which are each formed from sampling defects from a particular percentage of unit cells of each test structure. In one embodiment, yield for a defect type j on layer i in a particular sub test structure is calculated using the following equation (1):

$$Y_{ij} = \frac{1 - \text{Number of failing cells}}{\text{Total number of unit cells}} \quad (1)$$

The total yield for the product chip is then calculated by combining the yield for the different substructures. The following equation (2) shows the relationship between the total yield and the yield for each of seven substructures S1 through S2:

$$ln(Y_{total}) = ln(Y_{s1}) + ln(Y_{s2}) + ln(Y_{s3}) + ln(Y_{s4}) + ln(Y_{s5}) + ln(Y_{s6}) + ln(Y_{s7}) \quad (2)$$

Other types of test structures may be utilized, besides the test structure illustrated in FIGS. 3 and 4. Preferably, some of the test structures have characteristics that affect random yield as the test structures illustrated in FIGS. 3 and 4, while other test structures have characteristics that affect systematic yield. Total yield is affected by a number of parameters. The equation (3) for yield is shown below:

$$Y_{ij} = Y_{oij} e^{-D_{oij} \int_{X_o}^{\infty} A_{cij}(r) DSD_{ij}(r) dr}$$

where $D_{oij}$ equals the total number of defects for defect type y on layer i per unit area (e.g., unit cell), $Y_{oij}$ equals $1-Y_{sij}$, where $Y_{sij}$ is the systematic yield loss for defect type j on layer i, $A_{cij}(r)$ equals the critical area of defect type j on layer i, and DSD(r) equals the defect size distribution of defect type j on layer i. The parameter $D_{oij}$ is generally referred to as the random yield component, and $Y_{oij}$ is referred to as the systematic yield component. Accordingly, each test structure may be designed to include characteristics that affect either of these two parameters. The above illustrated test structures work well for predicting random type yield. Other types of test structures work better for systematic type yield prediction (process margin or pattern related failures), and such test structure types are well known to those skilled in the art. By way of example, pairs of adjacent short and long conductive lines may be used as the unit cell, which has a higher probability of failures than a pair of equally long conductive lines (such as those illustrated in FIG. 3) configured at the same design rules. By way of another example, each cell may include a straight line and a bent line. In another example, each cell may have a different via density. Finally, a cell may include a long line over a via and a short line over a via.

A test chip may be designed to include test structure having different types of test structures that work well for predicting different types of systematic or random yield predictions. For example, the test chip may include test structures that may be selectively sampled to mimic a particular critical area and test structures that mimic systematic attributes that affect systematic yield. For random yield prediction, the above described techniques may be used. For systematic yield prediction, the same number and type of patterns may be sampled from the different systematic test structures as occur on a particular product chip that adversely affect systematic yield. Thus, yield may be accurately predicted for the particular product chip since the sampled test patterns may be selected to correspond to the patterns on the particular product chip that contribute to both the systematic and random yield components of the yield equation (3). The yield from the random type substructures is then combined with the yield from the systematic type substructure to obtain the total yield of the product chip (i.e., random yield x systematic yield).

The above sampling techniques may be applied to other applications, besides predicting yield for an existing product chip design. For instance, the test chip may be used to assess the feasibility of a proposed product chip design before it is implemented. Additionally, a separate test chip does not have to be designed for each product design since the same test chip may be sampled differently to obtain different yield predictions for different product designs. The yield results from the test chip may then be fed back to the product designers (including fabless foundries) so that they can design a more robust product chip that is less likely to fail. In other words, the designers will now know which designs will likely have the highest yield by using a single test chip across multiple designs. Additionally, the test chip may be used to determine which types of patterns result in the highest yield. Other patterns that result in lower yield may then be avoided in the product chip.

Figure 7:
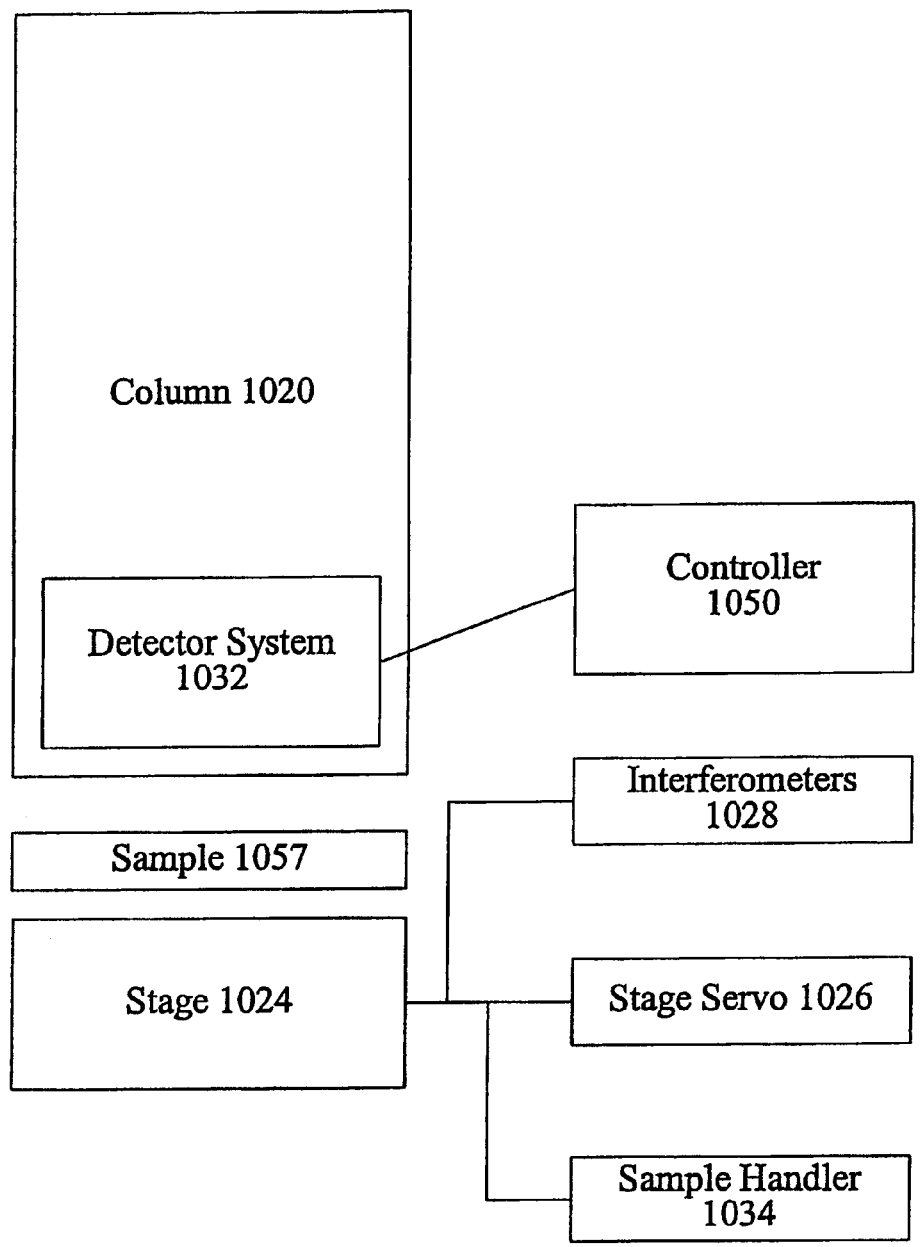
FIG. 7 is a diagrammatic representation of a system in which the techniques of the present invention may be implemented.

FIG. 7 is a diagrammatic representation of a scanning electron microscope (SEM) system in which the techniques of the present invention may be implemented. The detail in FIG. 7 is provided for illustrative purposes. One skilled in the art would understand that variations to the system shown in FIG. 7 fall within the scope of the present invention. For example, FIG. 7 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 can be configured to have six degrees of freedom including movement and rotation along the x-axis, y-axis, and z-axis. In a preferred embodiment, the stage 1024 is aligned relative to the particle beam 1020 so that the x-directional motion of the stage is corresponds to an axis that is perpendicular to a longitudinal axis of inspected conductive lines. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. According to a preferred embodiment, the stage 1024 is grounded to thereby ground the substrate and any structure tied to the substrate (e.g., grounded test structure conductive lines) to allow voltage contrast between the floating and grounded structures as the result of scanning the targeted features.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the defect sampling and yield prediction techniques of the present invention. The controller may also be configured to correlate the coordinates of the electron beam with respect to the sample with coordinates on the sample to thereby determine, for example, a location of a determined electrical defect. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, sampling percentage areas, test structure characteristics (e.g., line width and spacing values), critical area curve calculations, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of sampling a plurality of semiconductor test structures, comprising:
   in a voltage contrast inspection, sampling defects from a first set of selected percentage areas of one or more semiconductor test structures; and
   combining the sampled defects from the first set of selected percentage areas,
   wherein the first set of the percentage areas are selected so as to achieve a first critical area curve associated with the combined sampled defects from the first set of selected percentage areas that substantially matches a second critical area curve of at least a portion of a product chip).

2. A method as recited in claim 1, further comprising:
in a voltage contrast inspection, sampling defects from a second set of selected percentage areas of one or more semiconductor test structures; and
combining the sampled defects from the second set of selected percentage areas, wherein the second set of the percentage areas are selected so that the combined sampled defects from the second set of selected percentage areas have an associated second critical area curve that differs from the first critical area curve.

3. A method as recited in claim 2, wherein the first critical area curve substantially matches a first product chip's critical area curve and the second critical area curve substantially matches a second product chip's critical area curve.

4. A method as recited in claim 2, further comprising:
predicting a first yield based on the sampled defects from the first set of selected percentage areas, wherein the first yield is applicable to any product chip having the same first critical area curve as the sampled defect data from the first set of selected percentage areas, and
predicting a second yield based on the sampled defects from the second set of selected percentage areas, wherein the predicted yield is applicable to any product chip having the same first critical area curve as the sampled defect data from the second set of selected percentage areas.

5. A method as recited in claim 4, further comprising:
providing the first and second yields to designers of product chips; and
designing a product chip that has the same characteristics as the semiconductor test structures that were sampled to achieve either the first or second yield, whichever is higher.

6. A method as recited in claim 4, further comprising:
providing the first and second yields to designers of product chips; and
designing a product chip that excludes the same characteristics as the semiconductor test structures that were sampled to achieve either the first or second yield, whichever is lower.

7. A method as recited in claim 1, where the selected percentage areas correspond to a specific number of unit cells of each semiconductor test structure.

8. A method as recited in claim 7, wherein each unit cell includes a conductive line that is designed to have a high potential and a conductive line that is designed to have a low potential during a voltage contrast inspection.

9. A method as recited in claim 7, wherein each unit cell has a relatively small granularity that is equal to or less than 25 $\mu$m.

10. A method as recited in claim 1, wherein a first percentage area of a first semiconductor test structure is sampled for defects and a second percentage area of a second semiconductor test structure is sampled for defects, and wherein the first percentage area differs from the second percentage area.

11. A method as recited in claim 10, wherein the semiconductor test structures also include a third, fourth, fifth, sixth, and seventh semiconductor test structure and a third percentage area is sampled from the third semiconductor test structure, a fourth percentage area is sampled from the fourth semiconductor test structure, a fifth percentage area is sampled from the fifth semiconductor test structure, a sixth percentage area is sampled from the sixth semiconductor test structure, and a seventh percentage area is sampled from the seventh semiconductor test structures.

12. A method as recited in claim 10, wherein the first semiconductor test structure has a first set of characteristics that differ from a second set of characteristics of the second semiconductor test structures.

13. A method as recited in claim 12, where the first and second set of characteristics each include a set of line width and line spacing values.

14. A method as recited in claim 1, further comprising:
predicting a first yield based on the sampled defects from the first set of selected percentage areas,
wherein the first yield is applicable to any product chip having the same first critical area curve as the sampled defect data from the first set of selected percentage areas.

15. A method as recited in claim 14, wherein the semiconductor test structures include random semiconductor test structures that are designed for accurate prediction of the first yield and systematic semiconductor test structures that are designed for accurate prediction of a systematic yield for a same type of structure as the systematic semiconductor test structures, the method further comprising:
selectively sampling the systematic semiconductor test structures for defects so that the systematic yield is predicted for selected types of structures; and
combining the first yield and the systematic yield into a total yield.

16. A method as recited in claim 14, further comprising providing the total yield to designers of product chips.

17. A method as recited in claim 16, further comprising designing a product chip based on the provided total yield.

18. A computer program product for sampling a plurality of semiconductor test structures using an inspection system, the computer program product comprising:
at least one computer readable medium;
computer program instructions stored within the at least one computer readable product configured to cause the inspection system to:
sample defects in a voltage contrast inspection from a first set of selected percentage areas of one or more semiconductor test structures; and
combine the sampled defects from the first set of selected percentage areas, wherein the first set of selected percentage areas are selected so as to achieve a first critical area curve associated with the combined sampled defects from the first set of selected percentage areas that substantially matches a second critical area curve of at least a portion of a product chip.

19. A computer program product as recited in clam 18, the at least one computer readable product being further configured to cause the inspection system to:
sample defects in a voltage contrast inspection from a second set of selected percentage areas of one or more semiconductor test structures; and
combine the sampled defects from a second set of selected percentage areas, wherein the combined set of percentage areas are selected so that the combined sampled defects from the second set of selected percentage areas have an associated second critical area curve that differs from the first critical area curve.

20. A computer program product as recited in claim 19, the at least one computer readable product being further configured to cause the inspection system to:
predict a first yield based on the sampled defects from the first set of percentage areas, wherein the first yield is applicable to any product chip having the same first critical area curve as the sampled defect data from the first set of percentage areas, and predict a second yield based on the sampled defects from the second set of percentage area, wherein the predicted yield is applicable to any product chip having the same first critical area curve as the sampled defect data from the second set of percentage areas.

21. An inspection system for sampling a plurality of semiconductor test structures, the system comprising:

beam generator for generating an electron beam;

a detector for detecting electrons; and a controller arranged to:
sample defects in a voltage contrast inspection from a first set of selected percentage areas of one or more semiconductor test structures; and combine the sampled defects from the first set of selected percentage areas, wherein the combined first set of the percentage areas are selected so as to achieve a first critical area curve associated with the combined sampled defects from the first set of selected percentage areas that substantially matches a second critical area curve of at least a portion of a product chip.

22. An inspection system as recited in claim 21, the controller being further arranged to:
sample defects in a voltage contrast inspection from a second set of selected percentage areas of one or more semiconductor test structures; and combine the sampled defects from a second set of selected percentage areas, wherein the second set of percentage areas are selected so that the combined sampled defects from the second set of selected percentage areas have an associated second critical area curve that differs from the first critical area curve.

23. An inspection system as recited in claim 22, the controller being further arranged to:
predict a first yield based on the sampled defects from the first set of percentage areas, wherein the first yield is applicable to any product chip having the same first critical area curve as the sampled defect data from the first set of percentage areas, and predict a second yield based on the sampled defects from the second set of percentage area, wherein the predicted yield is applicable to any product chip having the same first critical area curve as the sampled defect data from the second set of percentage areas.

* * * * *